(12) United States Patent
Matsuo et al.

(10) Patent No.: US 7,348,230 B2
(45) Date of Patent: Mar. 25, 2008

(54) MANUFACTURING METHOD OF SEMICONDUCTOR DEVICE

(75) Inventors: Shuji Matsuo, Hitachinaka (JP);
Katsuhiro Uchimura, Hitachinaka (JP);
Yasuko Yoshida, Hitachinaka (JP);
Kota Funayama, Hitachinaka (JP);
Yutaka Takeshima, Yamaguchi (JP)

(73) Assignee: Renesas Technology Corp., Tokyo (JP)

( * ) Notice: Subject to any disclaimer, the term of this patent is extended or adjusted under 35 U.S.C. 154(b) by 275 days.

(21) Appl. No.: 11/008,276

(22) Filed: Dec. 10, 2004

(65) Prior Publication Data

US 2005/0145897 A1    Jul. 7, 2005

(30) Foreign Application Priority Data

Dec. 10, 2003   (JP)   ............................. 2003-411509

(51) Int. Cl.
*H01L 21/336*   (2006.01)
(52) U.S. Cl. ...................... 438/197; 438/664; 438/683; 438/745
(58) Field of Classification Search ................ 438/197, 438/592, 649, 651, 664, 683, 745
See application file for complete search history.

(56) References Cited

U.S. PATENT DOCUMENTS 5,776,822 A *   7/1998   Fujii et al. ................... 438/586

| | | | |
|---|---|---|---|
| 2002/0004303 A1* | 1/2002 | Agnello et al. | 438/689 |
| 2002/0031915 A1* | 3/2002 | Ito | 438/721 |
| 2002/0155697 A1 | 10/2002 | Akram et al. | |
| 2003/0181005 A1 | 9/2003 | Hachimine et al. | |
| 2005/0000942 A1* | 1/2005 | Lee et al. | 216/83 |
| 2005/0116360 A1* | 6/2005 | Huang et al. | 257/900 |

FOREIGN PATENT DOCUMENTS

JP    2003-273240    9/2003

* cited by examiner

*Primary Examiner*—Tuan H. Nguyen
(74) *Attorney, Agent, or Firm*—Antonelli, Terry, Stout & Kraus, LLP.

(57) ABSTRACT

A method of manufacture of a semiconductor device includes forming a gate insulating film and a gate electrode made of polycrystalline silicon over a semiconductor substrate; implanting ions into the semiconductor substrate to form a semiconductor region as a source or drain; forming a cobalt film and a titanium nitride film over the semiconductor substrate to cover the gate electrode; carrying out annealing to cause a reaction between Co and Si and the semiconductor region to form a CoSi layer; carrying out wet cleaning to remove the titanium nitride film and unreacted cobalt film to leave the CoSi layer over the gate electrode and semiconductor region; carrying out annealing to cause a reaction between the CoSi layer and the gate electrode and semiconductor region to form a $CoSi_2$ layer; carrying out HPM cleaning; and forming over the semiconductor substrate a silicon nitride film by low-pressure CVD to cover the gate electrode.

16 Claims, 12 Drawing Sheets

MANUFACTURING METHOD OF SEMICONDUCTOR DEVICE

CROSS-REFERENCE TO RELATED APPLICATION

The present application claims priority from Japanese patent application No. 2003-411509, filed on Dec. 10, 2003, the content of which is hereby incorporated by reference into this application.

BACKGROUND OF THE INVENTION

The present invention relates in general to a method of manufacture of a semiconductor device and to a semiconductor device, more particularly, the invention relates to a technique that is effective when applied to the manufacture of a semiconductor device having an MISFET (Metal Insulator Semiconductor Field Effect Transistor).

A method of forming a contact hole by using a self aligned contact process is conventionally known. A contact hole is formed, for example, in the following manner: A silicon nitride film and a silicon oxide film are formed successively over the main surface of a semiconductor substrate so as to cover a gate electrode with these films. Using a photoresist pattern that has been formed over the silicon oxide film by photolithography as an etching mask, the silicon oxide film is etched under conditions facilitating preferential etching of the silicon oxide film while using the silicon nitride film as an etching stopper film. The silicon nitride film is then etched using the photoresist pattern as an etching mask under conditions facilitating preferential etching of the silicon nitride film, whereby a contact hole from which a semiconductor substrate region is exposed is formed.

Japanese Unexamined Patent Publication No. 2003-273240 describes the manufacture of a semiconductor device having an n-type-FET and a p-type-FET, which comprises the steps of forming a first insulating film generating a tensile stress in the channel formation region of the n-type-FET, so as to cover gate electrodes of the n-type-FET and p-type-FET, while covering a semiconductor region between the gate electrode of the p-type-FET and an element isolation region of a semiconductor substrate; selectively removing the first insulating film over the p-type-FET by etching; forming a second insulating film generating a compression stress in the channel formation region of the p-type-FET over the n-type-FET and p-type-FET, so as to cover the gate electrodes thereof; and selectively removing the second insulating film over the n-type-FET.

[Patent Document 1]

Japanese Unexamined Patent Publication No. 2003-273240

SUMMARY OF THE INVENTION

As a result of investigation, the present inventors have found for the first time that the above-described process involves a problem, as described below.

Generation of a tensile stress in the channel region of an n channel MISFET is effective for improving the source•drain current of the n channel MISFET. The tensile stress can be generated in the channel region of an n channel MISFET by forming a silicon nitride film for self aligned contact process over a semiconductor substrate by using low-pressure CVD so as to cover a gate electrode.

The present inventors have found that, when, for the purpose of reducing the contact resistance, a cobalt silicide layer is formed over a gate electrode and a semiconductor region serving as a source•drain by the Salicide (Self Aligned Silicide) process and, then, a silicon nitride film for self aligned contact process is formed over the semiconductor substrate, including the upper surface of the cobalt silicide layer, by low-pressure CVD, there is a possibility that the silicon nitride film will exhibit an abnormal growth. If an abnormal growth of the silicon nitride film occurs, an abnormal growth portion of the silicon nitride film remains on the bottom of a contact hole upon formation thereof in an interlayer insulating film, and it increases the contact resistance between the plug formed in the contact hole and the gate electrode or semiconductor region serving as a source•drain, which may lead to a conduction failure therebetween. This lowers the reliability of the semiconductor device thus manufactured and reduces the production yield.

An object of the present invention is to provide a technology capable of improving the reliability of a semiconductor device.

The above-described and the other objects and novel features of the invention will be apparent from the following description herein and the accompanying drawings.

An outline of typical aspects and advantages of the invention disclosed herein will be described next.

In one aspect of the invention, a silicon nitride film is formed after the formation of a refractory metal silicide layer over the surface of a semiconductor region serving as a source or drain or over the surface of a gate electrode, and, then, wet cleaning is carried out.

In another aspect of the invention, a silicon nitride film is formed after the formation of a refractory metal silicide layer over the surface of a semiconductor region serving as a source or over drain or the surface of a gate electrode, and, then, plasma treatment is carried out.

In a further aspect of the invention, a silicon nitride film is formed after the formation of a refractory metal silicide layer over the surface of a semiconductor region serving as a source or drain or over the surface of a gate electrode, and, then, sputter etching is carried out.

In a still further aspect of the invention, a silicon nitride film is formed by CVD after the formation of a refractory metal silicide layer over the surface of a semiconductor region serving as a source or drain or over the surface of a gate electrode, and, then, the formation of a silicon nitride film by plasma CVD, a silicon oxide film by plasma CVD or a silicon oxide film by CVD is performed without using a silane gas.

Advantages made available by the typical aspects of the invention disclosed herein will be described briefly.

The reliability of a semiconductor device can be improved by the present invention.

DETAILED DESCRIPTION OF THE INVENTION

Figure 1:
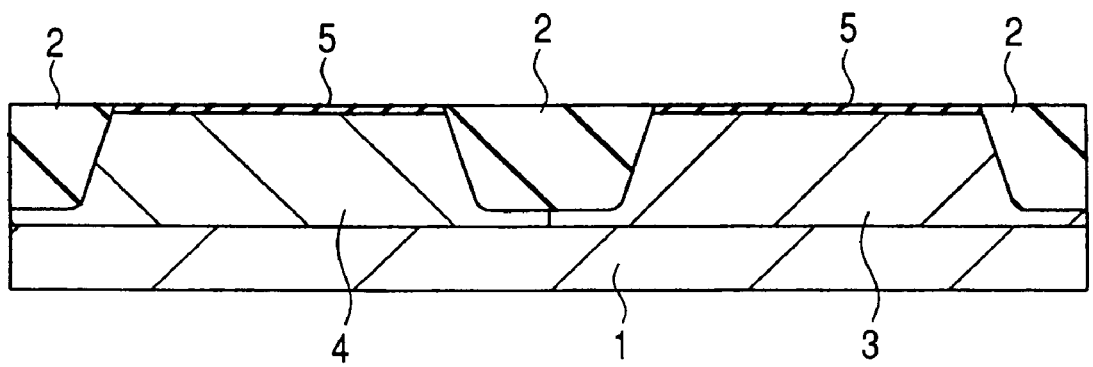
FIG. 1 is a fragmentary cross-sectional view of a semiconductor device according to one embodiment of the invention during a manufacturing step.

Various embodiments of the invention will be described specifically based on the accompanying drawings. In all of the drawings, members having a like function will be identified by like reference numerals, and overlapping descriptions thereof will be omitted. In the following description of the embodiments, a description of the same or similar portion is not repeated in principle unless otherwise particularly necessary.

In the drawings used to illustrate the embodiments, hatching is sometimes omitted even from a cross-sectional view for facilitating an understanding of it. On the other hand, even a plan view is sometimes hatched for facilitating an understanding of it.

Embodiment 1

A semiconductor device according to this Embodiment and the manufacturing steps thereof will be described with reference to the accompanying drawings. FIG. 1 is a fragmentary cross-sectional view of a semiconductor device, for example, a CMISFET (Complementary Metal Insulator Semiconductor Field Effect Transistor), according to one embodiment of the invention, as seen during a manufacturing step.

As illustrated in FIG. 1, a semiconductor substrate (semiconductor wafer) 1, which is made of, for example, a p type single crystal silicon having a specific resistance of from 1 to 10 Ωcm, is prepared. Over the main surface of the semiconductor substrate 1, an element isolation region 2 is formed. The element isolation 2 is made of silicon oxide and it can be formed, for example, by STI (Shallow Trench Isolation) or LOCOS (Local Oxidization of Silicon).

A p-well 3 and an n-well 4 are each formed in the semiconductor substrate 1 to a predetermined depth from the main surface of the substrate 1. The p-well 3 is formed, for example, by ion implantation of a p type impurity, such as boron (B), while the n-well 4 is formed, for example, by ion implantation of an n type impurity, such as arsenic (As).

A gate insulating film 5 is then formed over the surfaces of the p-well 3 and n-well 4. The gate insulating film 5 is made of, for example, a thin silicon oxide film, and it can be formed, for example, by thermal oxidation.

Figure 2:
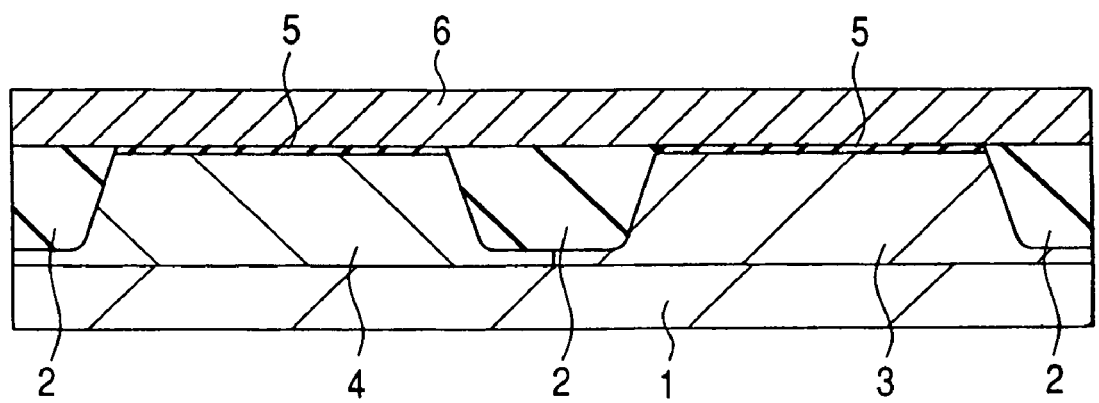
FIG. 2 is a fragmentary cross-sectional view of the semiconductor device during a manufacturing step following that of FIG. 1.

As illustrated in FIG. 2, a polycrystalline silicon film, for example, is formed as a conductor film 6 over the gate insulating film 5 of the p-well 3 and n-well 4. Using a photoresist film (not illustrated) as a mask, an n type impurity, such as phosphorus (P) or arsenic (As), is ion-implanted into a region of the conductor film (polycrystalline silicon film) 6 in which an n channel MISFET is to be formed, whereby a low resistance n type semiconductor film is formed. On the other hand, using another photoresist film (not illustrated) as a mask, a p type impurity, such as boron (B), is ion-implanted into a region of the conductor film (polycrystalline silicon film) 6 in which a p channel MISFET is to be formed, whereby a low resistance p type semiconductor film is formed.

Figure 3:
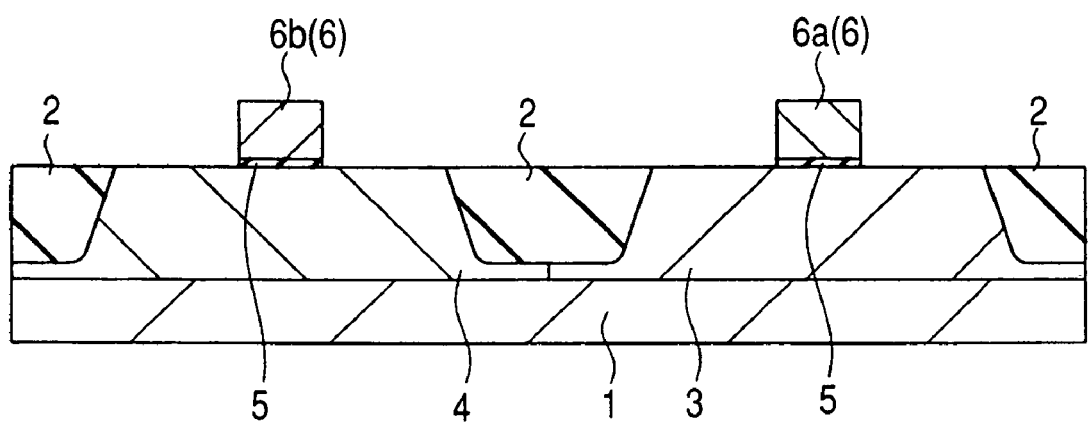
FIG. 3 is a fragmentary cross-sectional view of the semiconductor device during a manufacturing step following that of FIG. 2.

As illustrated in FIG. 3, the conductor film (polycrystalline silicon film) 6 is patterned using photolithography and dry etching, whereby gate electrodes 6a and 6b made of the conductor film (polycrystalline silicon film) 6 are formed. The gate electrode 6a, which will be a gate electrode of the n channel MISFET, is made of polycrystalline silicon (n type semiconductor film) having an n type impurity introduced therein, while the gate electrode 6b, which will be a gate electrode of the p channel MISFET, is made of polycrystalline silicon (p type semiconductor film) having a p type impurity introduced therein.

Figure 4:
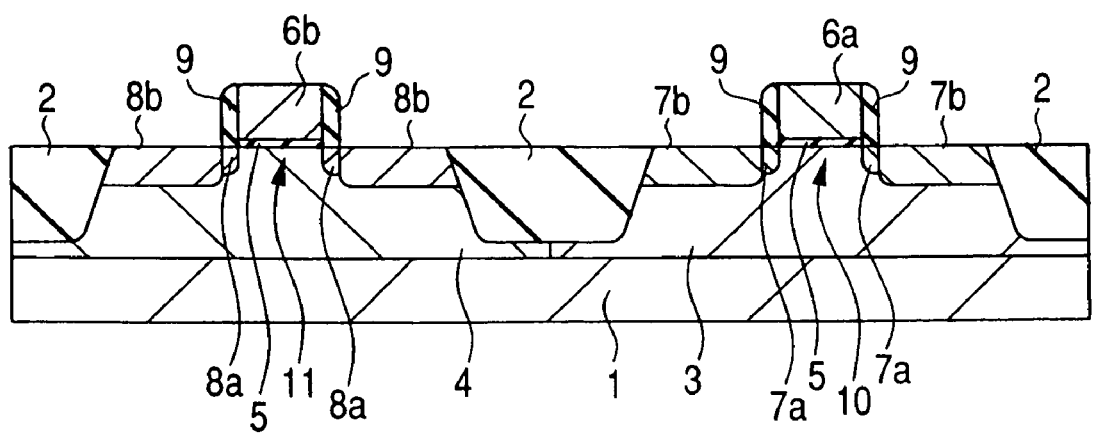
FIG. 4 is a fragmentary cross-sectional view of the semiconductor device during a manufacturing step following that of FIG. 3.

As illustrated in FIG. 4, an n type impurity, such as phosphorus (P) or arsenic (As), is ion-implanted into a region on both sides of the gate electrode 6a of the p-well 3 to form (a pair of) n⁻ type semiconductor regions 7a, while a p type impurity, such as boron (B), is ion-implanted into a region on both sides of the gate electrode 6b of the n-well 4 to form (a pair of) p⁻ type semiconductor regions 8a.

Over the side walls of each of the gate electrodes 6a and 6b, a sidewall spacer or sidewall film 9 made of a silicon oxide film, a silicon nitride film or a film stack of them is formed as an insulating film. The sidewall film 9 can be formed, for example, by depositing a silicon oxide film (or a silicon nitride film or a film stack of these films) over the semiconductor substrate 1, and, then, anisotropically etching this silicon oxide film (or a silicon nitride film or a film stack of these films).

After the formation of the sidewall film 9, (a pair of) n⁺ type semiconductor regions 7b (source and drain) are formed, for example, by the ion implantation of an n type impurity, such as phosphorus (P) or arsenic (As), into a region on both sides of the gate electrode 6a and sidewall film 9 over the p-well 3, while (a pair of) p⁺ type semiconductor regions 8b (source and drain) are formed by the ion implantation of a p type impurity, such as boron (B), into a region on both sides of the gate electrode 6b and sidewall film 9 over the n-well 4. After the ion implantation, the impurities thus introduced can be activated by annealing (for example, heat treatment at about 1000° C. for about 1 second). The impurity concentration of the n⁺ type semiconductor regions 7b is higher than that of the n⁻ type semiconductor regions 7a, and the impurity concentration of the p⁺ type semiconductor regions 8b is higher than that of the p⁻ type semiconductor regions 8a. By the steps so far described, an n type semiconductor region (impurity diffusion layer), which functions as the source or drain of the n channel type MISFET, is formed from the n⁺ type semiconductor region (impurity diffusion layer) 7b and n⁻ type semiconductor region 7a, while a p type semiconductor region (impurity diffusion layer), which functions as the source or drain of the p channel type MISFET, is formed from the p⁺ type semiconductor region (impurity diffusion layer) 8b and p⁻ type semiconductor region 8a.

In such a manner, an n channel MISFET (Metal Insulator Semiconductor Field Effect Transistor) 10 is formed over the p-well 3, while a p channel MISFET (Metal Insulator Semiconductor Field Effect Transistor) 11 is formed over the n-well 4.

Figure 5:
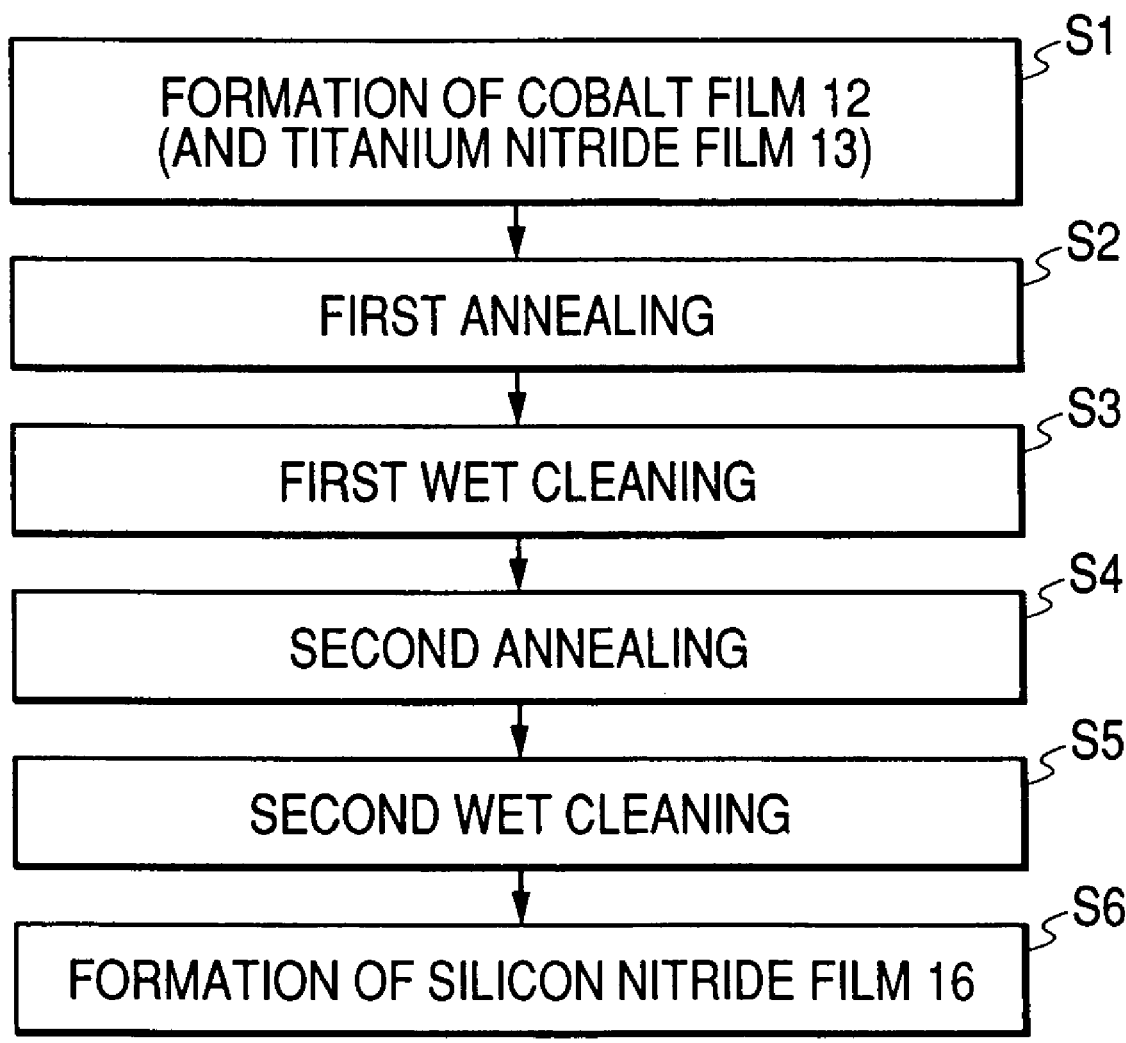
FIG. 5 is a flow chart of a manufacturing process showing steps in the manufacture of the semiconductor device according to the one embodiment of the invention.

FIG. 5 is a flow chart of a manufacturing process showing steps in the manufacture of the semiconductor device according to this Embodiment. It is a flow chart of a manufacturing process starting from a step of forming a refractory metal silicide layer (a metal•semiconductor reaction layer) over the surfaces of the gate electrodes 6a and 6b, n⁺ type semiconductor regions 7b and p⁺ type semiconductor regions 8b by the Salicide (Self Aligned Silicide) process after the formation of the structure, as illustrated in FIG. 4, until the step of forming a silicon nitride film for self-aligned contact (which will hereinafter be abbreviated as "SAC"). FIGS. 6 to 14 are fragmentary cross-sectional views illustrating the semiconductor device during manufacturing steps following that of FIG. 4. FIG. 5 is a flow chart of the manufacturing process from FIG. 6 to FIG. 9.

Figure 6:
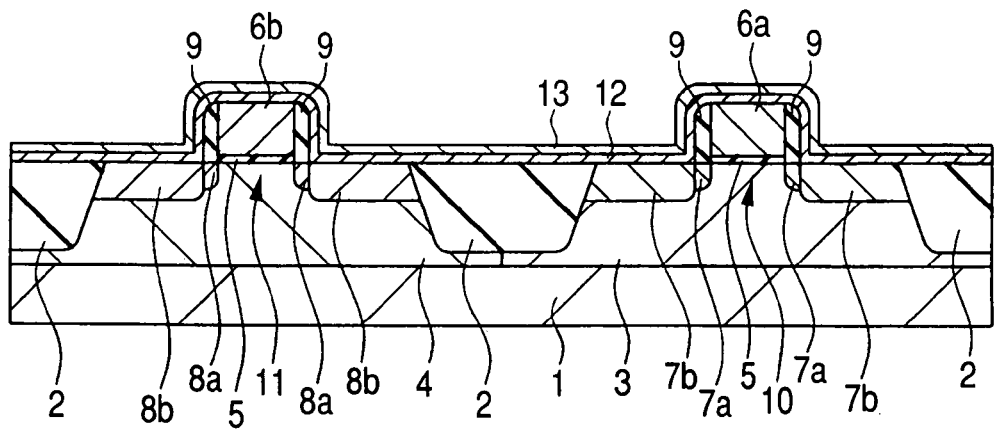
FIG. 6 is a fragmentary cross-sectional view of the semiconductor device during a manufacturing step following that of FIG. 4.

After the structure illustrated in FIG. 4 is formed, the surfaces of the gate electrodes 6a and 6b, n⁺ type semiconductor regions 7b, and p⁺ type semiconductor regions 8b are exposed. A refractory metal film, for example, a cobalt (Co) film 12, is then deposited over the whole surface of the semiconductor substrate 1, including the upper surfaces of the gate electrodes 6a and 6b, n⁺ type semiconductor regions 7b and p⁺ type semiconductor regions 8b by sputtering, followed by the deposition of a titanium nitride (TiN) film 13 over the cobalt film 12, for example, by sputtering (Step S1), as illustrated in FIG. 6. The thickness of the cobalt film 12 is, for example, about 8 nm and that of the titanium nitride film 13 is, for example, 15 nm. By this step, the film stack consisting of the cobalt film 12 and the titanium nitride film 13 is formed over the gate electrodes 6a and 6b, n⁺ type semiconductor regions 7b and p⁺ type semiconductor regions 8b. The titanium nitride film 13 serves as a cap film, and it has the function of an antioxidant film for preventing oxidation of the surface of the cobalt film 12 during the conversion of the cobalt (Co) film 12 into a cobalt silicide (CoSi$_2$) layer 15. However, formation of the titanium nitride film 13 may be omitted.

Then, first annealing (first heat treatment) is performed (Step S2). The first annealing can be performed, for example, at a temperature of about 480° C. in a nitrogen (N$_2$ gas) atmosphere. By this first annealing, silicon (Si) of the gate electrodes 6a and 6b and the semiconductor substrate 1 (the n⁺ semiconductor regions 7b and p⁺ type semiconductor regions 8b, here) reacts with the refractory metal film (the cobalt film 12, here) to form a refractory metal silicide layer, which is a metal•semiconductor reaction layer, that is, a CoSi (cobalt silicide) layer 14. More specifically, Co of the cobalt film 12 is reacted with Si of the polycrystalline silicon (polysilicon) constituting the gate electrodes 6a and 6b (Co+Si→CoSi) to form the CoSi layer 14 over the surfaces of the gate electrodes 6a and 6b, Co of the cobalt film 12 is reacted with Si of the n⁺ semiconductor regions 7b to form the CoSi layer 14 over the surfaces of the n⁺ semiconductor regions 7b, and Co of the cobalt film 12 is reacted with Si of the p⁺ type semiconductor regions 8b to form the CoSi layer 14 over the surfaces of the p⁺ type semiconductor regions 8b.

Figure 7:
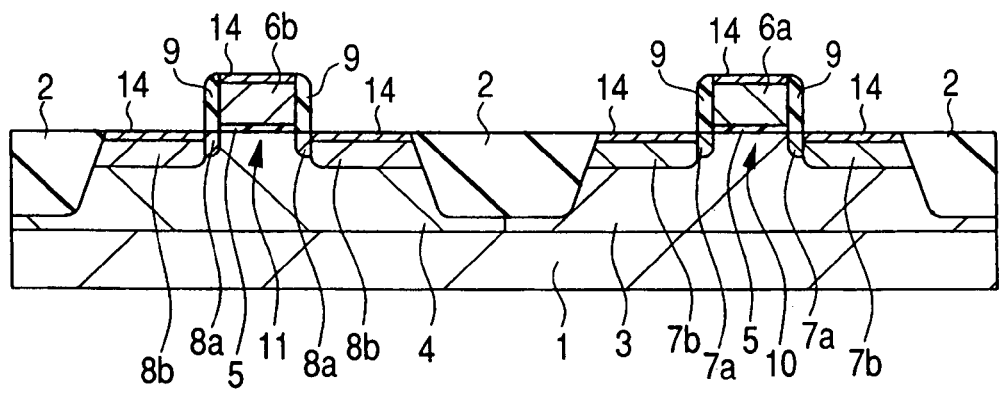
FIG. 7 is a fragmentary cross-sectional view of the semiconductor device during a manufacturing step following that of FIG. 6.

First, wet cleaning is performed (Step S3) by which, as illustrated in FIG. 7, the titanium nitride film 13 and an unreacted portion of the cobalt film 12 (a portion of the cobalt film 12 which has not reacted with the gate electrode 6a or 6b, n⁺ type semiconductor region 7b or p⁺ type semiconductor region 8b) are removed, and the CoSi layer 14 is left over the surfaces of the gate electrodes 6a and 6b, n⁺ type semiconductor regions 7b and p⁺ type semiconductor regions 8b.

As the first wet cleaning, APM cleaning and, then, HPM cleaning are carried out. HPM cleaning may be followed by APM cleaning. For APM cleaning, a mixed solution of ammonia (NH$_3$ or NH$_4$OH), hydrogen peroxide (H$_2$O$_2$) and water (H$_2$O) (a solution containing ammonia and aqueous hydrogen peroxide) is used as a cleaning solution. The primary purpose of APM cleaning is to remove contaminant particles (particles) from the main surface of the semiconductor. For HPM cleaning, a mixed solution of hydrochloric acid (HCl), hydrogen peroxide (H$_2$O$_2$) and water (H$_2$O) (a solution containing hydrochloric acid and aqueous hydrogen peroxide) is used as a cleaning solution. The primary purpose of HPM cleaning is to remove metal contaminants. By the first wet cleaning, the titanium nitride film 13 and an unreacted portion of the cobalt film 12 can be removed. In addition, contaminant particles (particles) or metal contaminants can be removed from the surface of the semiconductor substrate 1. The first wet cleaning is preferably carried out using a single wafer cleaning apparatus (single wafer cleaning method). Re-deposition of the particles or metal contaminants, which have once been removed by the first wet cleaning, on the semiconductor substrate 1 via the cleaning solution can be suppressed or prevented by the use of this single wafer cleaning apparatus, instead of a batch-wafer system cleaning apparatus.

Second annealing (second heat treatment) is then performed (Step S4). This second annealing can be carried out, for example, at a temperature of about 700° C. in a nitrogen ($N_2$) gas atmosphere. By this second annealing, a more stable refractory metal silicide film (metal•semiconductor reaction layer), that is, a $CoSi_2$ layer 15, is formed by causing a further reaction (for example, $CoSi+Si \rightarrow CoSi_2$) between the refractory metal silicide film (CoSi layer 14, here) formed by the first annealing and silicon (Si) of the gate electrodes 6a and 6b, or semiconductor substrate 1 ($n^+$ semiconductor regions 7b and $p^+$ type semiconductor regions 8b, here). More specifically, the second annealing is performed to cause a further reaction between the CoSi layer 14 and the polycrystalline silicon (polysilicon) constituting the gate electrodes 6a and 6b and, thereby, to form the $CoSi_2$ layer 15 over the surfaces of the gate electrodes 6a and 6b, to cause a further reaction between the CoSi layer 14 and Si of the $n^+$ semiconductor regions 7b and, thereby, to form the $CoSi_2$ layer 15 over the surfaces of the $n^+$ semiconductor regions 7b, and, then, to cause a further reaction between the CoSi layer 14 and Si of the $p^+$ type semiconductor regions 8b, and, thereby, to form the $CoSi_2$ layer 15 over the $p^+$ type semiconductor regions 8b.

Second wet cleaning is then performed (Step S5). HPM cleaning is employed here as the second wet cleaning. In HPM cleaning, a mixture (solution containing hydrochloric acid and aqueous hydrogen peroxide) of hydrochloric acid (HCl), hydrogen peroxide ($H_2O_2$) and water ($H_2O$) is used as the cleaning solution. This solution is similar to that used in HPM cleaning in Step 3.

Figure 9:
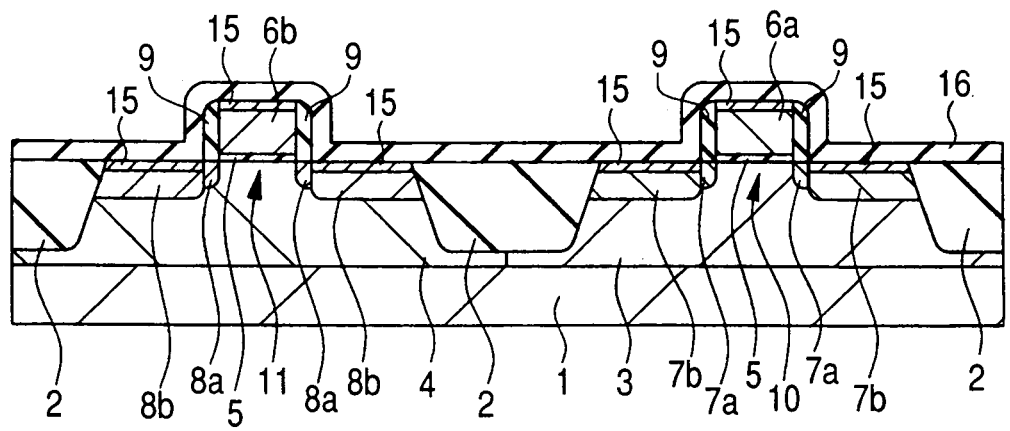
FIG. 9 is a fragmentary cross-sectional view of the semiconductor device during a manufacturing step following that of FIG. 8.

As illustrated in FIG. 9, a silicon nitride ($Si_xN_y$) film 16 is deposited over the semiconductor substrate 1 (Step S6). Moe specifically, the silicon nitride film 16 is formed over the semiconductor substrate 1, including the upper surface of the $CoSi_2$ layer 15, so as to cover the gate electrodes 6a and 6b. In this Embodiment, low-pressure CVD (low-pressure thermal CVD) is employed for the formation of an insulating film, for example, the silicon nitride film 16. The silicon nitride film 16 can be formed, for example, by using a single-wafer low-pressure CVD apparatus. The silicon nitride film 16 has a thickness of about 40 nm. As a gas for the formation of the silicon nitride film 16, a mixture of a monosilane ($SiH_4$) as a silane-based gas, an ammonia ($NH_3$) gas and a nitrogen ($N_2$) gas can be used. The silicon nitride film 16 is formed, for example, at a temperature of from 700 to 800° C. By forming the silicon nitride film 16 by low-pressure CVD (low-pressure thermal CVD), a tensile stress attributable to the thus formed silicon nitride film 16 occurs in the channel region of the n channel MISFET 10, whereby the $I_{ds}$ (source•drain current) of the n channel MISFET 10 can be improved (increased).

Instead of a monosilane ($SiH_4$) gas used as a silane-based gas, another silane-based gas, such as dichlorosilane ($SiCl_2H_2$) or disilane ($Si_2H_6$), can be used because a similar effect is available therefrom. In this Embodiment, low-pressure CVD (low-pressure thermal CVD) is employed for the formation of the insulating film 16 (silicon nitride film 16), but another method, such as ALD (Atomic Layer Deposition), can also be employed. In this Embodiment, a typical example using a monosilane ($SiH_4$) gas as the silane-based gas and low-pressure CVD as the forming method of the insulating film 16 (silicon nitride film 16) is described. It is needless to say that such a formation method can also be employed in Embodiments which will be described later.

In this Embodiment, the second wet cleaning (HPM cleaning) is performed after the second annealing, but before the formation of the silicon nitride film 16. By this second wet cleaning (HPM cleaning), Co-rich substances (for example, $Co_2Si$) or nuclei (nuclei which induce abnormal growth of the silicon nitride film 16) containing unreacted Co can be removed from the surface of the $CoSi_2$ layer 15, so that abnormal growth of the silicon nitride film 16 originating from such nuclei (abnormal growth inducing nuclei) can be prevented. Therefore, a silicon nitride film 16 that is free from abnormal growth and which has a relatively uniform thickness can be formed as desired.

Figure 10:
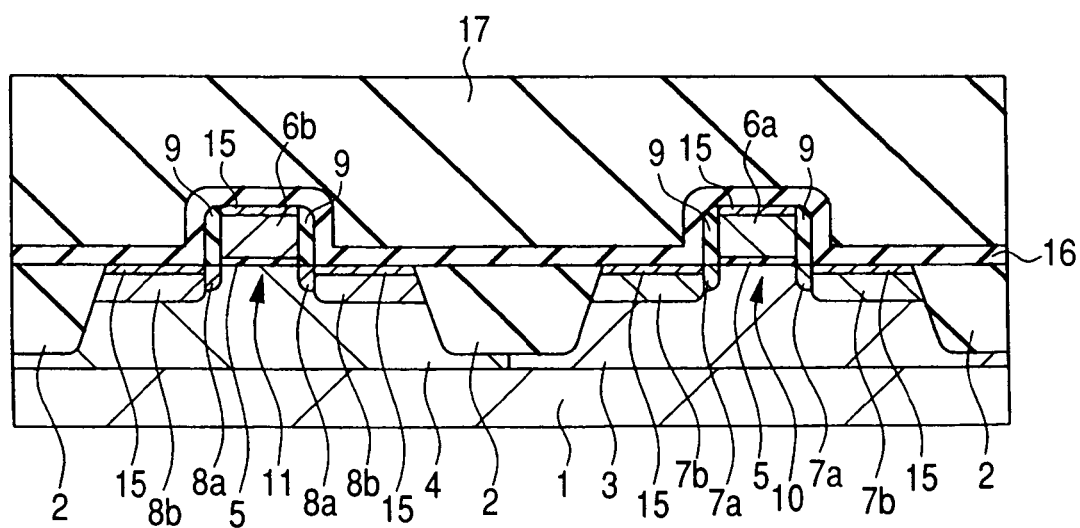
FIG. 10 is a fragmentary cross-sectional view of the semiconductor device during a manufacturing step following that of FIG. 9.

As illustrated in FIG. 10, an insulating film 17 made of a material different from the silicon nitride film 16, such as silicon oxide, is formed over the silicon nitride film 16. The insulating film 17, which is thicker than the silicon nitride film 16, is able to function as an interlayer insulating film.

Figure 11:
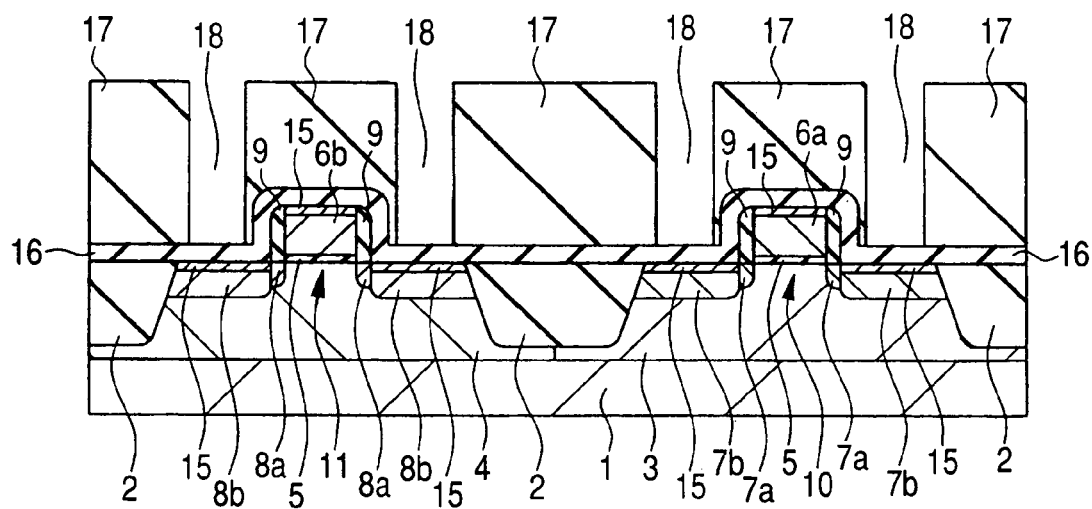
FIG. 11 is a fragmentary cross-sectional view of the semiconductor device during a manufacturing step following that of FIG. 10.

As illustrated in FIG. 11, a photoresist pattern (not illustrated) is formed over the insulating film 17 by photolithography. Using the photoresist pattern as an etching mask, the insulating film 17 is dry etched under conditions permitting selective etching of the insulating film 17 (compared with the insulating film 16) to form a contact hole 18 in the insulating film 17. In this dry etching of the insulating film 17, the silicon nitride film 16 is caused to function as an etching stopper film. In other words, the insulating film 17 is required to be made of a film that is different from the silicon nitride film 16 in etching selectivity ratio for an etching gas.

Figure 12:
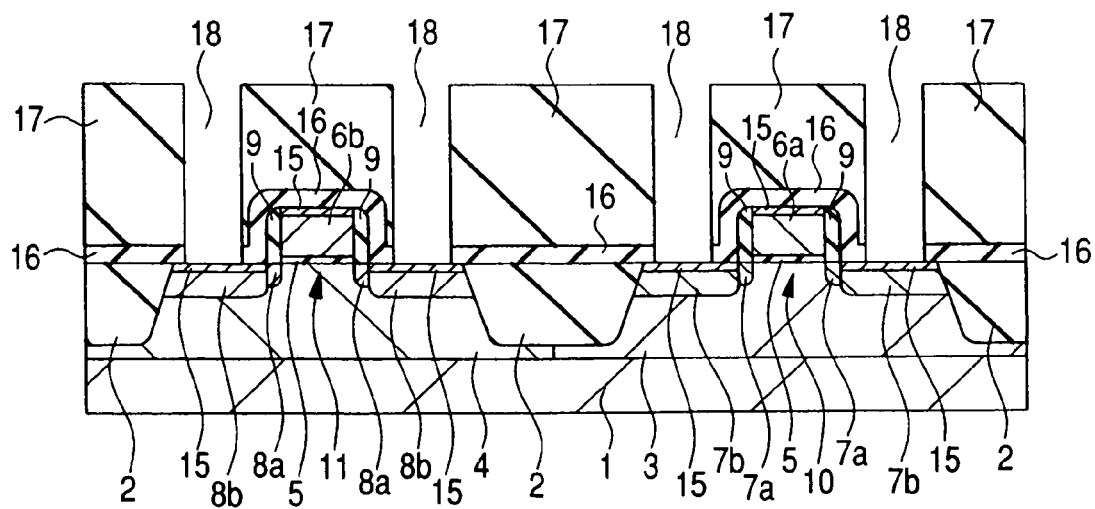
FIG. 12 is a fragmentary cross-sectional view of the semiconductor device during a manufacturing step following that of FIG. 11.

As illustrated in FIG. 12, using the photoresist pattern (not illustrated) as an etching mask, the silicon nitride film 16 on the bottom of the contact hole 18 is removed by dry etching under conditions permitting selective etching of the silicon nitride film 16 (compared with the insulating film 17), whereby the contact hole (hole) 18 is formed in the insulating film 17 and the silicon nitride film 16.

The contact hole 18 penetrates through the insulating film 17 and the silicon nitride film 16, and, from the bottom of the contact hole 18, a portion of the main surface of the semiconductor substrate 1, for example, a portion of the $CoSi_2$ layer 15 over the surfaces of the $n^+$ semiconductor region 7b and $p^+$ type semiconductor region 8b, or a portion of the $CoSi_2$ layer 15 over the surface of the gate electrodes 6a and 6b, is exposed. In the cross-sectional view of FIG. 12, a portion of the $CoSi_2$ layer 15 over the surfaces of the $n^+$ semiconductor regions 7b and $p^+$ type semiconductor regions 8b is exposed from the bottom of the contact hole 18. In an unillustrated region (in the cross-section of FIG. 12), the contact hole 18 is also formed over the gate electrodes 6a and 6b, and a portion of the $CoSi_2$ layer 15 over the surfaces of the gate electrodes 6a and 6b is also exposed from the bottom of the contact hole 18. In the above-described manner, the contact hole 18 can be formed in accordance with the SAC process by forming the silicon nitride film 16 and using this silicon nitride film 16 as an etching stopper film upon etching of the insulating film (interlayer insulating film) 17. This makes it possible, upon etching of the insulating film (interlayer insulating film 17) to form the hole (contact hole 18) for plug formation in the later step, the avoid damage to the underlying layer or deterioration in the accuracy of the processing size, which will otherwise occur by excessive etching.

Figure 13:
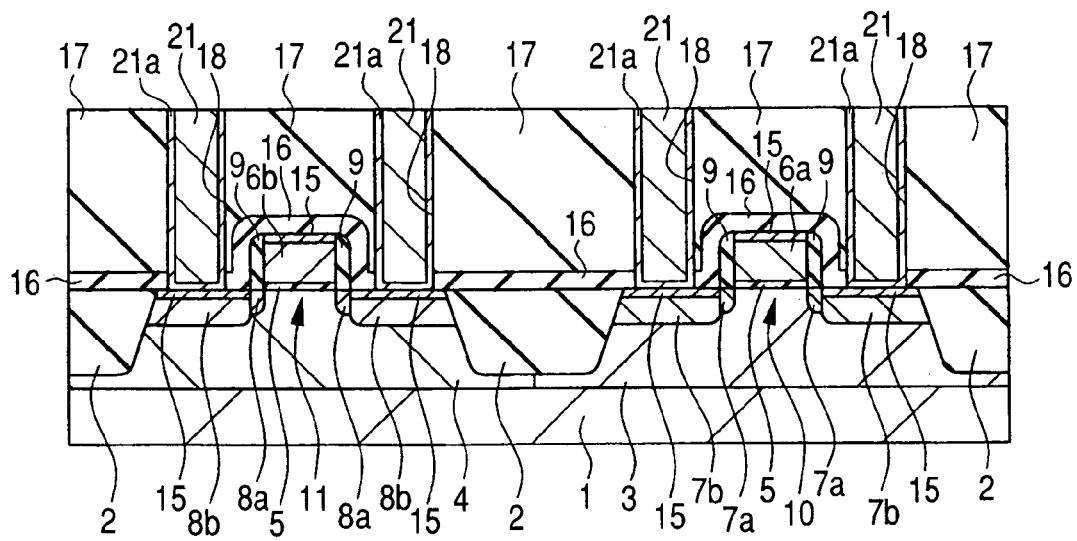
FIG. 13 is a fragmentary cross-sectional view of the semiconductor device during a manufacturing step following that of FIG. 12.

As illustrated in FIG. 13, a plug 21 made of tungsten (W) is formed in the contact hole 18. The plug 21 is formed, for example, by forming a titanium nitride film (or a film stack of a titanium film and a titanium nitride film) 21a as a barrier film over the insulating film 17, including the inside (over the bottom and inside walls) of the contact hole 18, forming over the titanium nitride film 21a a tungsten film by CVD (Chemical Vapor Deposition) to embed therewith the contact hole 18, and, then, removing the unnecessary tungsten film and titanium nitride film 21a over the insulating film 17 by CMP (Chemical Mechanical Polishing) or etch back.

Figure 14:
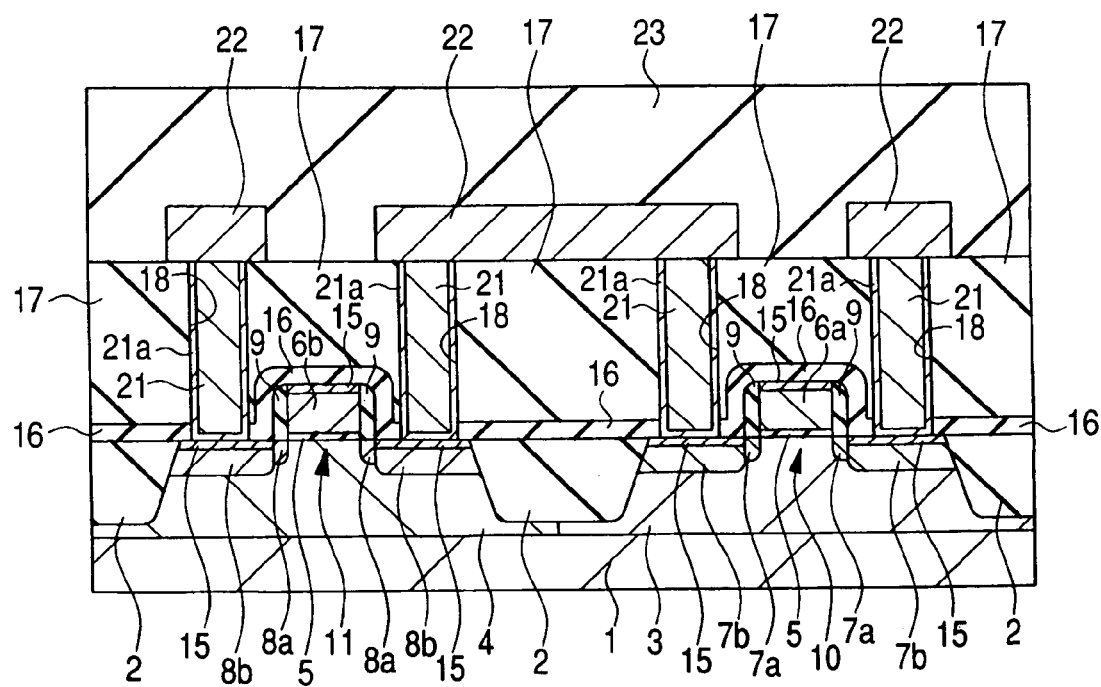
FIG. 14 is a fragmentary cross-sectional view of the semiconductor device during a manufacturing step following that of FIG. 13.

As illustrated in FIG. 14, an interconnect 22 made of tungsten is formed as a first level interconnect over the insulating film 17 having the plug 21 embedded therein. The interconnect 22 can be formed by forming a tungsten film over the insulating film 17, and, then patterning it by photolithography and dry etching. The interconnect 22 is electrically connected via the plug 21 to the n$^+$ semiconductor region 7b and p$^+$ type semiconductor region 8b for source or drain, or the gate electrodes 6a and 6b of the n channel MISFET 10 and p channel MISFET 11. The material of the interconnect 22 is not limited to tungsten, but various materials can be used. For example, a single-layer film such as aluminum (Al) or aluminum alloy, or a metal film stack having such a single-layer film with a metal film, such as a titanium (Ti) or titanium nitride (TiN) film stacked on or under such a single-layer film, can be used.

Over the insulating film 17, an insulating film 23 is then formed to cover the interconnect 22 therewith. In a similar manner to that employed for the formation of the contact hole 18, a via or through-hole is formed to expose a portion of the interconnect 22 from the insulating film 23, and, in a similar manner to that employed for the formation of the plug 21 or interconnect 22, a plug for embedding the through-hole or second level interconnect to be electrically connected to the interconnect 22 via the plug is formed, but a description of it is omitted here. The interconnects on and after the second level interconnect may be a buried copper interconnect made by the damascene process.

Figure 19:
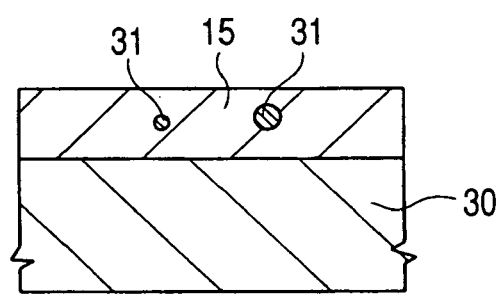
FIG. 19 is a fragmentary cross-sectional view of the semiconductor device during a manufacturing step following that of FIG. 18.
Figure 20:
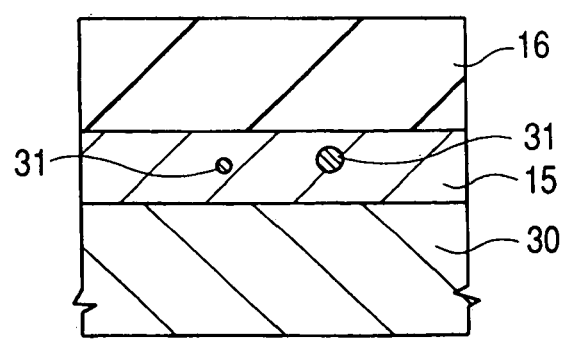
FIG. 20 is a fragmentary cross-sectional view of the semiconductor device during a manufacturing step following that of FIG. 19.
Figure 21:
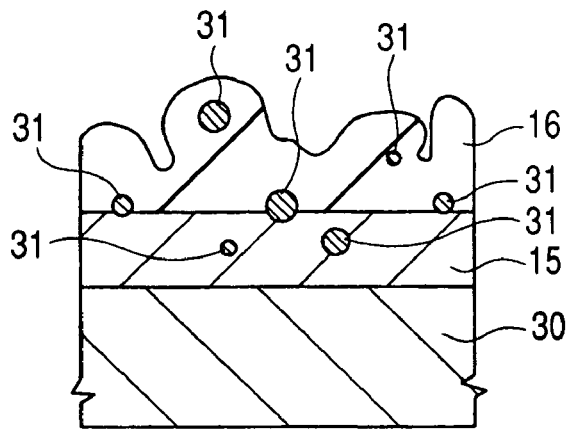
FIG. 21 is a fragmentary cross-sectional view of a semiconductor device representing of a comparative example during a manufacturing step.

The advantages of this embodiment will be described. FIGS. 15 to 20 are fragmentary cross-sectional views (schematic views) of the semiconductor substrate of this Embodiment during its manufacturing steps. In these drawings, schematic cross-sections of a region in the vicinity above the gate electrode 6a, gate electrode 6b, n$^+$ semiconductor region 7b or p$^+$ type semiconductor region 8b are illustrated. FIG. 21 is a fragmentary cross-sectional view (schematic view) of a semiconductor device representing a comparative example during a manufacturing step. The silicon region 30 illustrated in FIGS. 14 to 21 corresponds to the gate electrode 6a, gate electrode 6b, n$^+$ semiconductor region 7b or p$^+$ type semiconductor region 8b. When the silicon region corresponds to the gate electrode 6a or gate electrode 6b, the silicon region 30 is made of polycrystalline silicon (having an impurity introduced therein), while, when the silicon region 30 corresponds to the n$^+$ semiconductor region 7b or p$^+$ type semiconductor region 8b, the silicon region 30 is made of single crystal silicon (having an impurity introduced therein).

Figure 15:
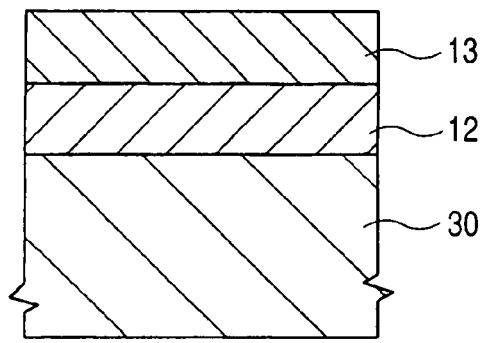
FIG. 15 is a fragmentary cross-sectional view of the semiconductor device according to the one embodiment of the invention during a manufacturing step.

FIG. 15 corresponds to the step stage of FIG. 6, that is, formation of the cobalt film 12 and titanium nitride film 13 in Step S1. Since the cobalt film 12 and the titanium nitride film 13 are formed successively over the gate electrodes 6a and 6b, n$^+$ semiconductor region 7b and p$^+$ type semiconductor region 8b, the cobalt film (refractory metal film) 12 and the titanium nitride film 13 are formed over the silicon region 30 successively, as illustrated in FIG. 15.

Figure 16:
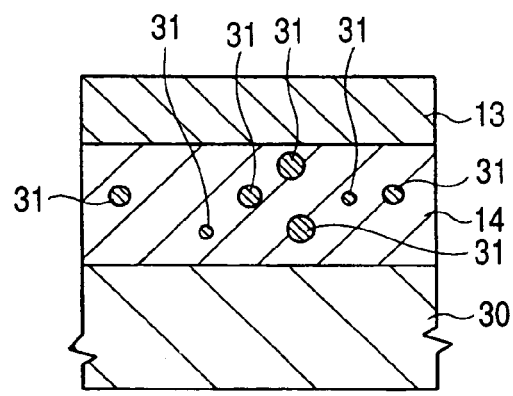
FIG. 16 is a fragmentary cross-sectional view of the semiconductor device during a manufacturing step following that of FIG. 15.

After the formation of the cobalt film 12 and titanium nitride film 13, the first annealing (first heat treatment) of Step S2 is performed as described above. FIG. 16 corresponds to the state after the first annealing. By the first annealing, Co of the cobalt film 12 and Si of the silicon region 30 react with each other (Co+Si→CoSi), and, as illustrated in FIG. 16, a CoSi layer 14 is formed as a refractory metal silicide layer over the silicon region 30. Upon this reaction, nuclei 31 (nuclei for inducing the abnormal growth of the titanium nitride film 16) made of Co-rich substances (such as $Co_2Si$) or unreacted Co appear in the CoSi layer 4. The investigation by the present inventors have revealed that the number of these nuclei 31 is greater in the n channel MISFET 10 (in other words, in the CoSi layer 14 over the gate electrode 6a or in the CoSi layer 14 over the n$^+$ semiconductor region 7b). In particular, when As (arsenic) has been introduced at high concentration in the silicon region below the cobalt film 12, a reaction inhibition by As (arsenic) occurs, which tends to accelerate the formation of the nuclei 31.

Figure 17:
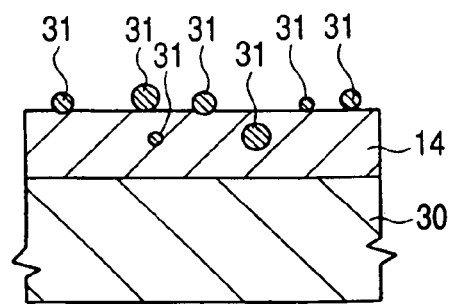
FIG. 17 is a fragmentary cross-sectional view of the semiconductor device during a manufacturing step following that of FIG. 16.

After the first annealing, the first wet cleaning of Step 3 is performed as described above. FIG. 17 corresponds to the step stage of FIG. 7. By the first wet cleaning, the titanium nitride film 13 and the cobalt film 12, which has remained unreacted, are removed as illustrated in FIG. 17. A portion of the nuclei 31 is exposed from the surface of the CoSi layer 14 remaining over the silicon region 30 after the first wet cleaning. Metal contaminants in the cleaning solution used for the first wet cleaning are sometimes re-deposited on the surface of the CoSi layer 14 and become other nuclei 31.

Figure 18:
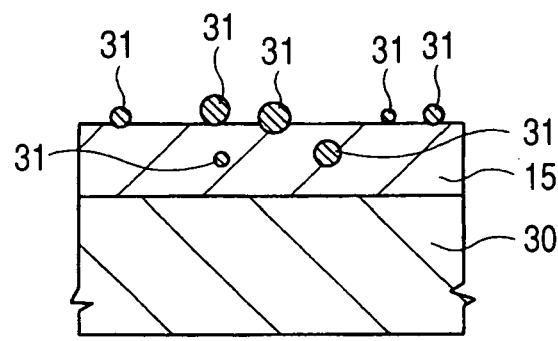
FIG. 18 is a fragmentary cross-sectional view of the semiconductor device during a manufacturing step following that of FIG. 17.

After the first wet cleaning, the second annealing (second heat treatment) of Step S4 is performed as described above. FIG. 18 corresponds to the state (step stage of FIG. 8) after the second annealing. By the second annealing, the reaction (CoSi+Si→$CoSi_2$) between the CoSi layer 14 and Si of the silicon region 30 occurs, and, as illustrated in FIG. 18, a $CoSi_2$ layer 15 is formed as a more stable refractory metal silicide layer over the silicon region 30. Even by the second annealing, the reaction of the nuclei 31 does not proceed compared with that in the CoSi layer, and the nuclei 31 remain on the surface and inside of the $CoSi_2$ layer 15.

When a different approach from this Embodiment is undertaken, Step 6, that is, the formation of the silicon nitride film 16 by low-pressure CVD is performed after the second annealing without the second wet cleaning of Step 5, there is a possibility that the abnormal growth of the silicon nitride film 16 may occur, originating from the nuclei 31 on the surface of the $CoSi_2$ layer 15. FIG. 19 corresponds to the state after the second wet cleaning of Step S5 after the second annealing, while FIG. 20 corresponds to the state (the step stage of FIG. 9) after Step S6, that is, film formation of the silicon nitride film 16 by low-pressure CVD following the second wet cleaning. FIG. 21 is a fragmentary cross-sectional view of the comparative example in which a different approach from this Embodiment is undertaken, the film formation of the silicon nitride film 16 by low-pressure CVD in Step S6 is performed after the second annealing without carrying out therebetween the second wet cleaning of Step S5. The region illustrated in FIG. 21 is similar to that illustrated in FIG. 20.

In the Comparative Example of FIG. 21, abnormal growth of the silicon nitride film 16, more specifically, a drastic and partial growth of the silicon nitride film 16 occurs. This abnormal growth of the silicon nitride film 16 is presumed to occur because upon film formation of the silicon nitride film 16, a silane-based gas as a reaction gas (film forming gas) is apt to react with a metal constituting the nuclei 31, which leads to the growth of silicon nitride ($Si_xN_y$) with the nuclei 31 as a starting point. The existence of the nuclei 31 on the surface of the $CoSi_2$ layer 15 inevitably causes abnormal growth of silicon nitride originating from them. An investigation by the present inventors has revealed that such abnormal growth of the silicon nitride film 16 tends to occur when the silicon nitride film 16 is formed by CVD (thermal CVD) while using a silane-based gas, such as monosilane ($SiH_4$) or dichlorosilane ($SiH_2Cl_2$), as a reaction gas (film forming gas), particularly when the silicon nitride film 16 is formed by low-pressure CVD (low-pressure thermal CVD). In low-pressure CVD (low-pressure thermal CVD), the silicon nitride film 16 is deposited by making use of the reaction on the surface of the semiconductor substrate 1, so that abnormal growth of the silicon nitride film 16 originating from the nuclei 31 tends to occur. When the abnormal growth of the silicon nitride film 16 occurs, an abnormal growth portion of the silicon nitride film 16 remains on the bottom of the contact hole 18 upon formation of the contact hole 18, leading to a possibility of an increased contact resistance occurring between the plug 21 and the gate electrode 6a, gate electrode 6b, $n^+$ semiconductor region 7b or $p^+$ type semiconductor region 8b. Moreover, there is a possibility that the conduction between the plug 21 and the gate electrode 6a, gate electrode 6b, $n^+$ semiconductor region 7b or $p^+$ type semiconductor region 8b will be disturbed. This lowers the reliability of the semiconductor device to be manufactured and decreases the production yield.

In this Embodiment, on the other hand, the silicon nitride film 16 is formed by low-pressure CVD (low-pressure thermal CVD) after the second wet cleaning following the second annealing. The nuclei 31 can be removed from the surface of the $CoSi_2$ layer 15, as illustrated in FIG. 19, by the second wet cleaning. Owing to the removal of the nuclei 31 from the surface of the $CoSi_2$ layer 15, even if the silicon nitride film 16 is formed by low-pressure CVD (low-pressure thermal CVD) using a silane-based gas, such as monosilane ($SiH_4$) or dichlorosilane ($SiH_2Cl_2$), as a reaction gas (film forming gas), abnormal growth of silicon nitride ($Si_xN_y$) starting from the nuclei 31 can be prevented and the silicon nitride film 16 having a relatively uniform thickness can be formed, as illustrated in FIG. 20, without causing abnormal growth.

By the second annealing, a $CoSi_2$ layer 15 that is more stable than the CoSi layer 14 is formed. Compared with the first wet cleaning, the second wet cleaning after the second annealing makes it possible to suppress the removal of $CoSi_2$ from the $CoSi_2$ layer 15 and to selectively remove from the (surface of the) $CoSi_2$ layer 15 the nuclei 31 made of Co-rich cobalt silicide (for example, $Co_2Si$) or unreacted Co. By the introduction of the second wet cleaning of Step S5, the nuclei 31 can be removed from the surface (surface layer portion) of the $CoSi_2$ layer 15 without adversely affecting it, whereby the abnormal growth of the silicon nitride film 16 can be prevented.

In this Embodiment, the abnormal growth of the silicon nitride film 16 can be prevented. When the contact hole 18 is formed, the $CoSi_2$ layer 15 over the gate electrode 6a, gate electrode 6b, $n^+$ semiconductor region 7b or $p^+$ type semiconductor region 8b can be exposed from the bottom of the contact hole 18. This makes it possible to lower the contact resistance between the plug 21 and the gate electrode 6a, gate electrode 6b, $n^+$ semiconductor region 7b or $p^+$ type semiconductor region 8b and, thereby, to ensure the necessary conduction therebetween. Accordingly, the reliability of the semiconductor device thus manufactured can be improved, and the production yield also can be improved.

The nuclei 31 on the surface of the $CoSi_2$ layer 15 can be removed completely by adopting, as the second cleaning, HPM cleaning using, as a cleaning solution, a mixture of hydrochloric acid (HCl), hydrogen peroxide ($H_2O_2$) and water ($H_2O$). For HMP cleaning, a cleaning apparatus used in another cleaning step of the semiconductor device can be used. This facilitates the introduction of the second cleaning, simplifies the manufacturing step or manufacturing apparatus of the semiconductor device, and, consequently, reduces the manufacturing cost of the semiconductor device.

In this Embodiment, since a refractory metal silicide film (the $CoSi_2$ layer 15, here) is formed over the gate electrodes 6a and 6b, $n^+$ semiconductor region 7b and $p^+$ type semiconductor region 8b in accordance with the Salicide process, a contact resistance between the plug 21 and the gate electrode 6a or 6b, or $n^+$ semiconductor region 7b or $p^+$ type semiconductor region 8b can be reduced, which leads to an improvement in the performance of the semiconductor device.

Use of plasma CVD, instead of the low-pressure CVD in this Embodiment, can be considered in order to suppress the abnormal growth of the silicon nitride film 16. When the silicon nitride film 16 is formed by plasma CVD, however, a compression stress occurs in the channel region of the n channel MISFET 10 owing to the silicon nitride film 16 thus formed. In this Embodiment, a tensile stress can be generated in the channel region of the n channel MISFET 10 owing to the silicon nitride film 16 thus formed in accordance with the low-pressure CVD (low-pressure thermal CVD) (using a silane-based gas such as monosilane or dichlorosilane as a reaction gas) so that the $I_{ds}$ (source•drain current) of the n channel MISFET 10 can be improved (increased). This leads to an improvement in the performance of the semiconductor device equipped with the n channel MISFET 10.

In this Embodiment, steps in the manufacture of a semiconductor device having a CMISFET were described, but this Embodiment can be applied to various semiconductor devices having a MISFET. Particularly, application of the present invention to a semiconductor device with an n channel MISFET is suited.

Embodiment 2

Figure 22:
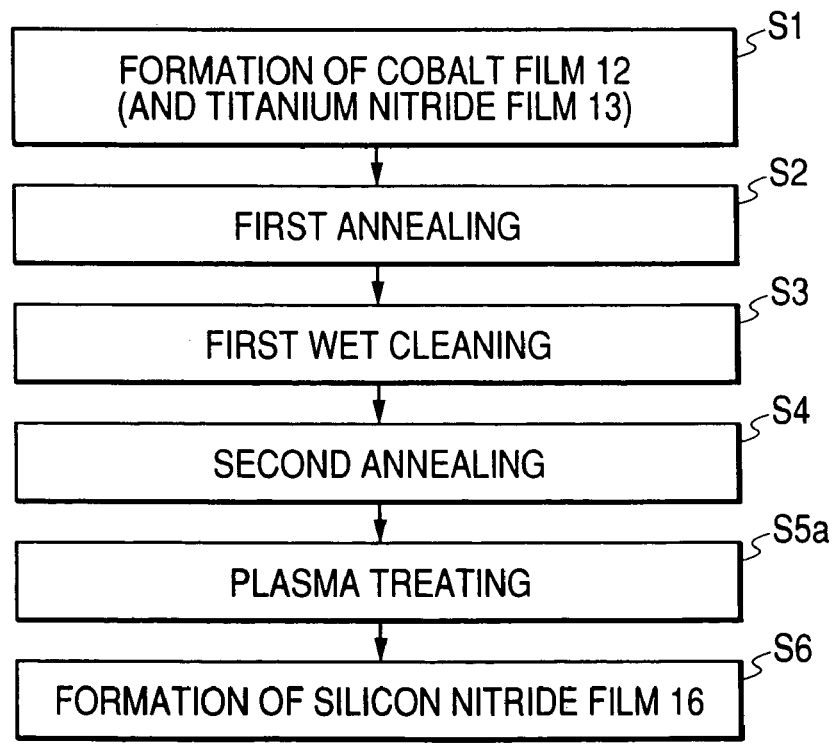
FIG. 22 is a flow chart of a manufacturing process showing the manufacture of a semiconductor device according to another embodiment of the invention.

FIG. 22 is a flow chart of a manufacturing process showing steps in the manufacture of a semiconductor device according to another embodiment of the invention. The manufacturing process is substantially similar to that of Embodiment 1 until the second annealing (second heat treatment) of Step S4. A description of the manufacturing steps prior to the second annealing of Step S4 is therefore omitted, and those steps performed thereafter will be described next.

In this Embodiment, the second wet cleaning of Step S5 of Embodiment 1 is replaced with plasma treatment using ammonia ($NH_3$). After the second annealing of Step S4 similar to Embodiment 1, plasma treatment is performed (Step S5a) in this Embodiment. Plasma treatment using ammonia ($NH_3$) is preferred. Nuclei 31 as described above can be chemically or physically removed from the surface of the $CoSi_2$ layer 15 by this plasma treatment (ammonia plasma treatment).

After the plasma treatment of Step S5a, a silicon nitride film 16 is formed by low-pressure CVD (low-pressure thermal CVD) in a similar manner to that employed in Embodiment 1. Steps after the formation of the silicon nitride film 16 of Step S6 are similar to those of Embodiment 1 so that a description thereof is omitted.

By the removal of the nuclei 31 from the surface of the CoSi$_2$ layer 15 by the plasma treatment of Step S5a, abnormal growth of silicon nitride (Si$_x$N$_y$) originating from the nuclei 31 can be prevented in the film formation step of the silicon nitride film 16 by the low-pressure CVD (low-pressure thermal CVD), which makes it possible to form the silicon nitride film 16 with a relatively uniform thickness. When the contact hole 18 is formed, the gate electrode 6a, gate electrode 6b, n$^+$ semiconductor region 7b or p$^+$ type semiconductor region 8b can be exposed reliably from the bottom of the contact hole 18. This makes it possible to lower the contact resistance between the plug 21 and the gate electrode 6a, gate electrode 6b, n$^+$ semiconductor region 7b or p$^+$ type semiconductor region 8b and thereby to ensure the necessary conduction therebetween. Accordingly, this leads to an improvement in the reliability of the semiconductor device thus manufactured and also an improvement in the production yield.

In addition, by forming the silicon nitride film 16 by low-pressure CVD (low-pressure thermal CVD), a tensile stress can be generated in the channel region of the n channel MISFET 10 owing to the silicon nitride film 16 thus formed. This provides an improvement (increase) in the I$_{ds}$ (source•drain current) of the n channel MISFET 10 and, in turn, an improvement in the performance of the semiconductor device equipped with the n channel MISFET 10.

The plasma treatment as used in this Embodiment can be used in combination with the second wet cleaning as described in connection with Embodiment 1. By the plasma treatment performed before or after the second wet cleaning, the nuclei 31 can be removed more effectively from the surface of the CoSi$_2$ layer 15 than by the single use of the plasma treatment of this Embodiment.

Embodiment 3

Figure 23:
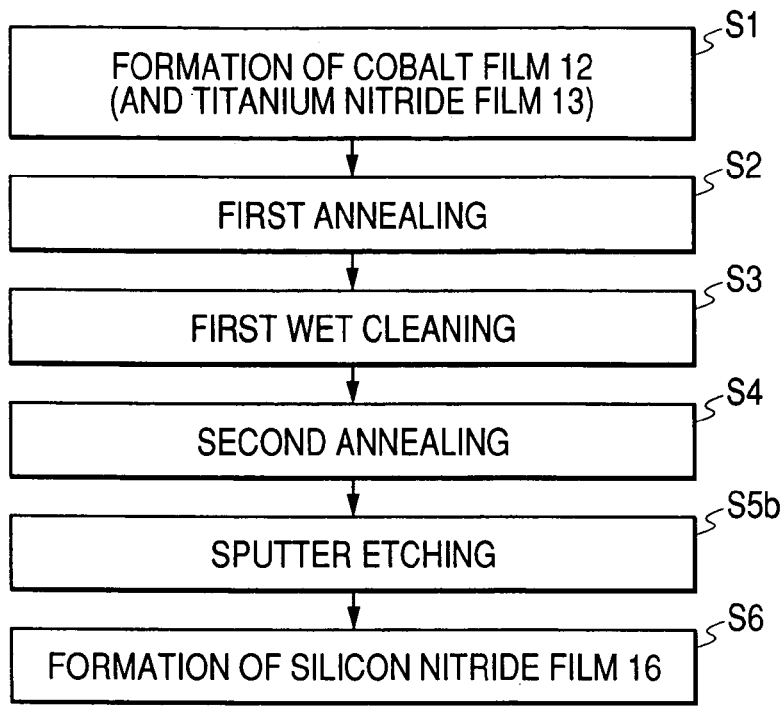
FIG. 23 is a flow chart of a manufacturing process showing the manufacture of a semiconductor device according to a further embodiment of the invention.

FIG. 23 is a flow chart of a manufacturing process showing steps in the manufacture of a semiconductor device according to a further embodiment of the invention. The manufacturing process is substantially similar to that of Embodiment 1 until the second annealing (second heat treatment) of Step S4. A description of the manufacturing steps up to the second annealing of Step S4 is therefore omitted, and those steps provided thereafter will be described next.

In this Embodiment, the second wet cleaning of Step S5 according to Embodiment 1 is replaced by sputter etching (sputter etch). More specifically, after the second annealing of Step S4 similar to that of Embodiment 1, sputter etching is performed by using, for example, argon (Ar) (Step S5b) in this Embodiment. Nuclei 31 as described above on the surface of the CoSi$_2$ layer 15 can be removed physically by this sputter etching. The nuclei 31 exist more in the vicinity of the surface of the CoSi$_2$ layer 15 than inside of the CoSi$_2$ layer 15. Removal of the surface layer portion of the CoSi$_2$ layer 15 by sputter etching exposes the clean surface inside of the CoSi$_2$ layer 15, and the nuclei 31 exposed from the surface of the CoSi$_2$ layer 15 can be reduced or removed.

After the sputter etching of Step S5b, a silicon nitride film 16 is formed by low-pressure CVD (low-pressure thermal CVD) in a similar manner to that employed in Embodiment 1. After Step S6 for the formation of the silicon nitride film 16, the steps are similar to those of Embodiment 1, so that a description thereof is omitted.

By the removal of the nuclei 31 from the surface of the CoSi$_2$ layer 15 by the sputter etching of Step S5b, abnormal growth of silicon nitride (Si$_x$N$_y$) originating from the nuclei 31 can be prevented in the film formation step of the silicon nitride film 16 by using low-pressure CVD (low-pressure thermal CVD), which enables the formation of the silicon nitride film 16 with a relatively uniform thickness. When the contact hole 18 is formed, the gate electrode 6a, gate electrode 6b, n$^+$ semiconductor region 7b or p$^+$ type semiconductor region 8b can be exposed reliably from the bottom of the contact hole 18. This makes it possible to lower the contact resistance between the plug 21 and the gate electrode 6a, gate electrode 6b, n$^+$ semiconductor region 7b or p$^+$ type semiconductor region 8b and, thereby, to ensure necessary the conduction therebetween. Accordingly, improvements in the reliability of the semiconductor device thus manufactured and the production yield can be accomplished.

In addition, by forming the silicon nitride film 16 by using low-pressure CVD (low-pressure thermal CVD), a tensile stress can be generated in the channel region of the n channel MISFET 10 owing to the silicon nitride film 16 thus formed, so that the I$_{ds}$ (source•drain current) of the n channel MISFET 10 can be improved (increased). This leads to an improvement in the performance of the semiconductor device equipped with the n channel MISFET 10.

The sputter etching as used in this Embodiment can be used in combination with the second wet cleaning, as described in connection with Embodiment 1, or with the plasma treatment as described in connection with is Embodiment 2. By such combined use, the nuclei 31 can be removed more effectively from the surface of the CoSi$_2$ layer 15 compared with the single use of the sputter etching of this Embodiment.

Embodiment 4

Figure 24:
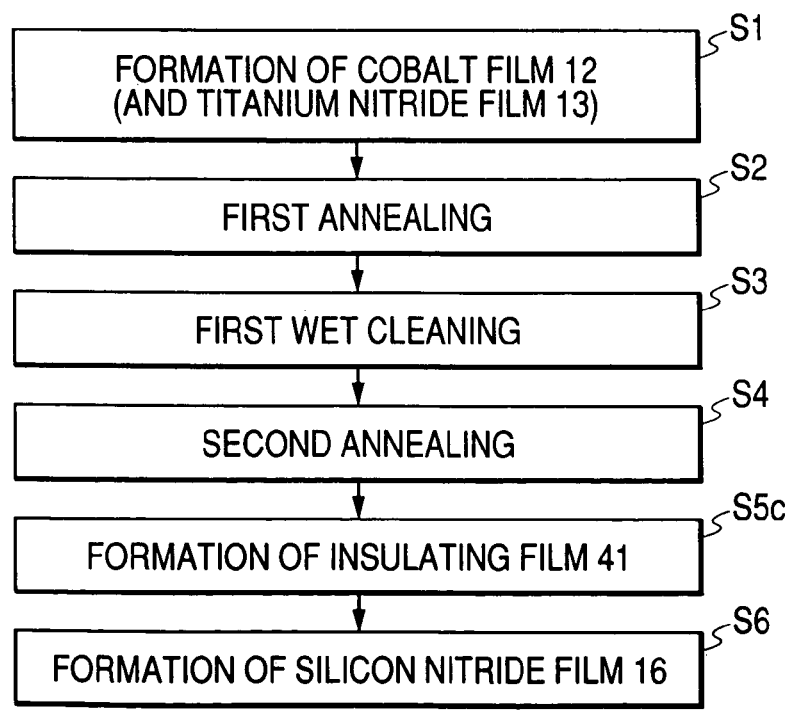
FIG. 24 is a flow chart of a manufacturing process showing the manufacture of a semiconductor device according to a still further embodiment of the invention.
Figure 25:
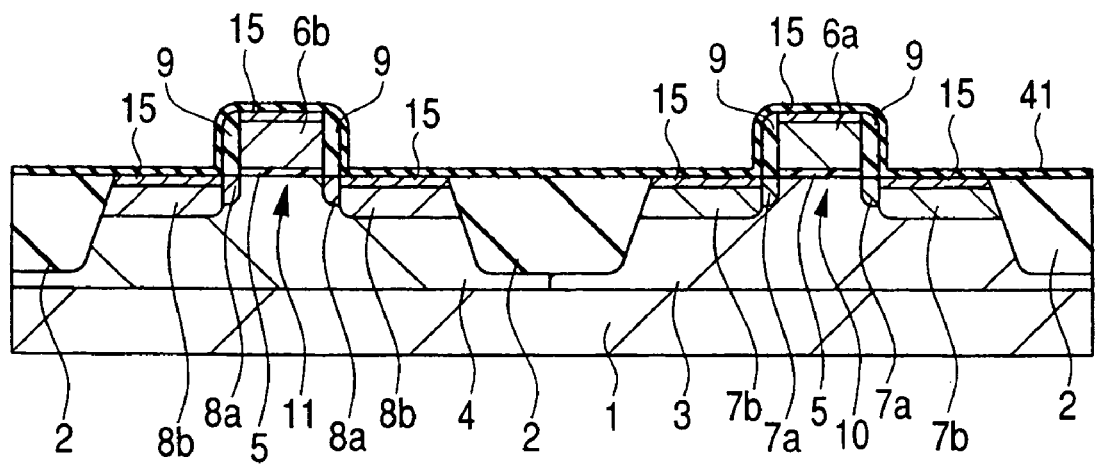
FIG. 25 is a fragmentary cross-sectional view of the semiconductor device according to the still further embodiment of the invention during a manufacturing step.
Figure 26:
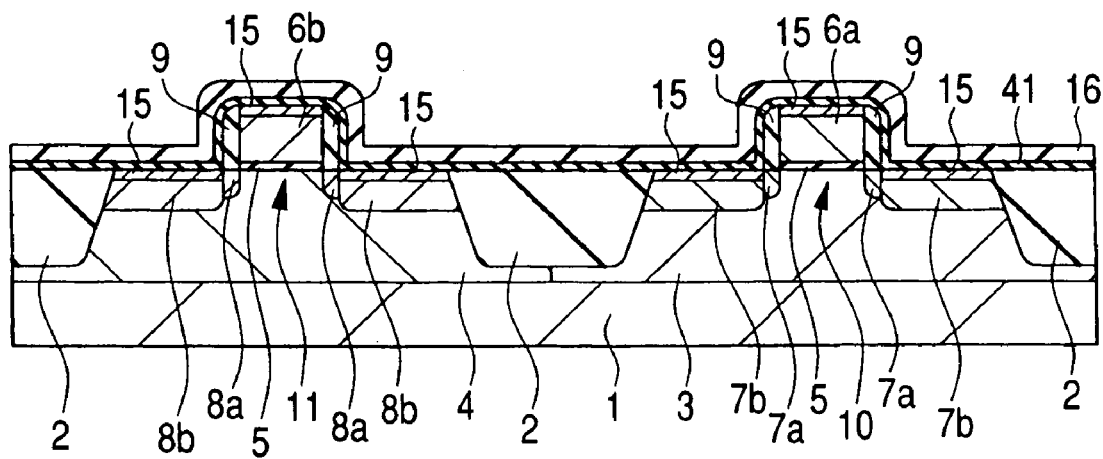
FIG. 26 is a fragmentary cross-sectional view of the semiconductor device during a manufacturing step following that of FIG. 25.

FIG. 24 is a flow chart of a manufacturing process showing steps in the manufacture of a semiconductor device according to a still further embodiment of the invention. FIGS. 25 and 26 are each a fragmentary cross-sectional view of the semiconductor device according to this still further embodiment of the invention during its manufacture. The manufacturing process is substantially similar to that of Embodiment 1 until the second annealing (second heat treatment) of Step S4. A description of the manufacturing steps up to the second annealing of Step S4 is therefore omitted, and those steps provided thereafter will be described next.

Figure 8:
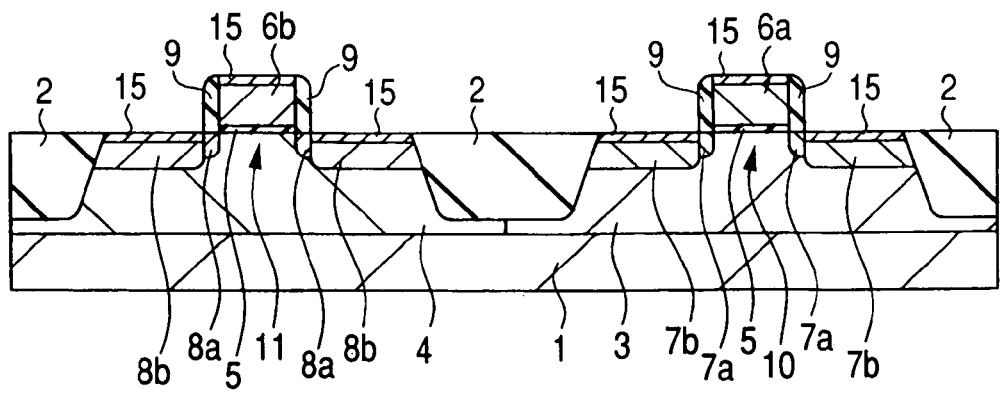
FIG. 8 is a fragmentary cross-sectional view of the semiconductor device during a manufacturing step following that of FIG. 7.

After the second annealing of Step S4 as carried out in Embodiment 1, an insulating film 41 is formed over the semiconductor substrate 1, as illustrated in FIG. 25 (Step S5c). More specifically, after the structure of FIG. 8 is formed, the insulating film 41 is formed over the semiconductor substrate 1, including the upper surface of the CoSi$_2$ layer 15, so as to cover the gate electrodes 6a and 6b. As this insulating film 41, a silicon nitride film formed by plasma CVD can be used. Alternatively, a silicon oxide film (for example, plasma TEOS (Tetraethoxysilane) oxide film)) formed by plasma CVD or a silicon oxide film (for example, an ozone (O$_3$) TEOS oxide film) formed by CVD without using, as a reaction gas, a silane-based gas, such as monosilane (SiH$_4$) or dichlorosilane (SiH$_2$Cl$_2$), can be used as the insulating film 41. In short, the insulating film 41 is formed in the presence of less silane-based gas compared with an insulating film 16 which will be described later.

The formation of the insulating film 41 of Step S5c is followed by the formation of a silicon nitride (Si$_x$N$_y$) film 16 over the insulating film 41 by low-pressure CVD (low-pressure thermal CVD) in Step S6, as illustrated in FIG. 26. The silicon nitride film 16 is a film generating a greater tensile stress than the insulating film 41. The silicon nitride film 16 has a thickness of about 40 nm. Steps after the formation of the silicon nitride film 16 of Step S6 are similar to those of Embodiment 1, so that a description thereof is omitted here.

In this Embodiment, the second annealing of Step S4 is followed by the formation of the insulating film 41 in Step S5c and, then, by the formation of the silicon nitride film 16 by low-pressure CVD in Step S6. In the formation of the insulating film 41 of Step S5c, the insulating film 41 is formed from silicon nitride by using plasma CVD. Compared with low-pressure CVD (low-pressure thermal CVD), the use of plasma CVD for the formation of the silicon nitride film causes a weak reaction on the surface of the semiconductor substrate 1. When a silicon nitride film is formed as the insulating film 41 by plasma CVD, abnormal growth of the silicon nitride film (insulating film 41) originating from the nuclei 31 can be suppressed or prevented even if the nuclei 31 exist on the surface of the CoSi$_2$ layer 15. When a silicon oxide film is formed as the insulating film 41 by plasma CVD, abnormal growth of the silicon oxide film (insulating film 41) originating from the nuclei 31 also can be suppressed or prevented. When the insulating film 41 is made of a silicon oxide film formed by CVD without using, as a reaction gas, a silane-based gas, such as monosilane (SiH$_4$) or dichlorosilane (SiH$_2$Cl$_2$), the insulating film 41 shows not an abnormal growth, but a relatively uniform growth, because a reaction between the silane-based gas and nuclei 31 does not occur. In short, the insulating film 41 should be formed in the presence of less silane-based gas compared with the insulating film 16 (silicon nitride film 16).

After the formation of the insulating film 41, the silicon nitride film 16 is formed over the insulating film 41 by low-pressure CVD (low-pressure thermal CVD). As the nuclei 31 do not exist on the surface of the insulating film 41 which lies below the silicon nitride film 16, local abnormal growth of the silicon nitride film 16 does not occur. This enables the formation of the silicon nitride film 16 (and insulating film 41) with a relatively uniform thickness. Therefore, a contact hole 18 is formed, the gate electrode 6a, gate electrode 6b, n$^+$ semiconductor region 7b or p$^+$ type semiconductor region 8b can be exposed reliably from the bottom of the contact hole 18. This makes it possible to lower the contact resistance between the plug 21 and the gate electrodes 6a, gate electrode 6b, n$^+$ semiconductor region 7b or p$^+$ type semiconductor region 8b and, thereby, to ensure the necessary conduction therebetween. Accordingly, improvement in the reliability of the semiconductor device thus manufactured and improvement in the production yield can be accomplished.

In addition, by forming the silicon nitride film 16 over the insulating film 41 by using low-pressure CVD (low-pressure thermal CVD), a tensile stress can be generated in the channel region of the n channel MISFET 10 owing to the silicon nitride film 16 thus formed, so that the I$_{ds}$ (source•drain current) of the n channel MISFET 10 can be improved (increased). This leads to an improvement in the performance of the semiconductor device equipped with the n channel MISFET 10.

When the insulating film 41 is made of a silicon nitride film formed by plasma CVD, upon formation of the contact hole 18 in the insulating film 17 (corresponding to the step stage of FIG. 11) and then removal of the silicon nitride film 16 and insulating film 41 from the bottom of the contact hole 18 by dry etching (corresponding to the step stage of FIG. 12), the silicon nitride film 16 and the insulating film 41 lying thereunder can be removed by only one dry etching without coordinating dry etching conditions for these two films, because the silicon nitride film 16 and the insulating film 41 are both made of silicon nitride. The contact hole 18 can therefore be formed by a simple step.

The insulating film 41 is preferably thinner than the silicon nitride film 16. By making the insulating film 41 thinner than the silicon nitride film 16, which is formed by low-pressure CVD (low-pressure thermal CVD), it is possible to reliably generate a tensile stress in the channel region of the n channel MISFET 10 by the silicon nitride film 16, which is a film capable of generating a greater tensile stress than the insulating film 41 and, thereby, to improve the I$_{ds}$ (source•drain current) of the n channel MISFET 10 even if the insulating film 41 acts to cause a compression stress in the channel region of the n channel MISFET 10. The thickness of the insulating film 41 ranging from 1 to 10 nm is preferred. By adjusting the thickness of the insulating film 41 to 1 nm or greater, abnormal growth of the silicon nitride film 16 to be formed over the insulating film 41, with which the surface of the CoSi$_2$ layer 15 is covered, can be prevented completely, while by adjusting the thickness of the insulating film 41 to 10 nm or less, a tensile stress is generated more reliably in the channel region of the n channel MISFET 10 by the silicon nitride film 16, whereby the I$_{ds}$ (source•drain current) of the n channel MISFET 10 can be improved further.

For the formation of the insulating film 41 as provided in this Embodiment, the second wet cleaning as described in connection with Embodiment 1, plasma treatment as described in connection with Embodiment 2 or sputter etching as described in connection with Embodiment 3 can be used in combination. The nuclei 31 can then be removed from the surface of the CoSi$_2$ layer 15 more effectively than the single use of the feature of this Embodiment, that is, the formation of the insulating film 41.

Advantages available by the typical embodiments, of the embodiments disclosed herein, will next be described briefly.

The reliability of a semiconductor device can be improved by inserting a wet cleaning step between the formation of a refractory metal silicide layer over the surface of a semiconductor region as a source or drain or the surface of a gate electrode and the formation of a silicon nitride film.

The reliability of a semiconductor device can be improved by inserting a plasma treatment step between the formation of a refractory metal silicide layer over the surface of a semiconductor region as a source or drain or the surface of a gate electrode and the formation of a silicon nitride film.

The reliability of a semiconductor device can be improved by inserting a sputter etching step between the formation of a refractory metal silicide layer over the surface of a semiconductor region as a source or drain or the surface of a gate electrode and the formation of a silicon nitride film.

The reliability of a semiconductor device can be improved by inserting, between the formation of a refractory metal silicide layer over the surface of a semiconductor region as a source or drain or the surface of a gate electrode and the formation of a silicon nitride film by CVD, a step of forming a silicon nitride film by plasma CVD, a silicon oxide film by plasma CVD or a silicon oxide film by CVD without using a silane-based gas.

The invention made by the present inventors has been described specifically based on its embodiments. However, should be borne in mind that the invention is not limited to these embodiments. It is needless to say that the invention can be modified within a range not departing from the scope of the invention.

In the above-described embodiments, a semiconductor device having a CMISFET was used as an example. The invention is not limited thereto, but can be applied to various semiconductor devices having a MISFET.

The semiconductor device of the invention is effective when applied to a semiconductor device having a MISFET.

The invention claimed is:

1. A manufacturing method of a semiconductor device having a MISFET, comprising the steps of:
   (a) preparing a semiconductor substrate;
   (b) forming a gate insulating film of the MISFET over the semiconductor substrate;
   (c) forming a gate electrode of the MISFET over the gate insulating film;
   (d) introducing an impurity into the semiconductor substrate to form semiconductor regions as a source and drain of the MISFET;
   (e) forming a refractory metal film over the semiconductor substrate including upper surfaces of the gate electrode and the semiconductor regions;
   (f) performing first heat treatment to cause a reaction between the refractory metal film and the gate electrode or the semiconductor regions to form refractory metal silicide layers;
   (g) after the step (f), removing the refractory metal film by a first wet cleaning, and leaving the refractory metal silicide layers over the gate electrode or the semiconductor regions;
   (h) after the step (g), performing second heat treatment to cause a reaction between the refractory metal silicide layers and the gate electrode or the semiconductor regions;
   (i) after the step (h), performing a second wet cleaning with a solution containing hydrochloric acid and aqueous hydrogen peroxide; and
   (j) after the step (i), forming a silicon nitride film over the semiconductor substrate including an upper surface of the refractory metal silicide layers.

2. A manufacturing method of a semiconductor device according to claim 1,
   wherein, in the step (g), the first wet cleaning is performed using a single wafer cleaning apparatus.

3. A manufacturing method of a semiconductor device according to claim 1,
   wherein the MISFET constitutes an n channel MISFET.

4. A manufacturing method of a semiconductor device according to claim 1,
   wherein, in the step (j), the silicon nitride film is formed by low-pressure CVD.

5. A manufacturing method of a semiconductor device according to claim 1,
   wherein, in the step (j), a silane-based gas is employed.

6. A manufacturing method of the semiconductor device according to claim 1,
   wherein after the step (h), the refractory metal silicide layers are cobalt silicide (CoSi$_2$) layers.

7. A manufacturing method of a semiconductor device having a MISFET, comprising the steps of:
   (a) forming a gate insulating film of the MISFET over a semiconductor substrate;
   (b) forming a gate electrode of the MISFET over the gate insulating film;
   (c) forming source and drain regions of the MISFET in the semiconductor substrate;
   (d) depositing Co films over the MISFET;
   (e) after the step (d), forming CoSi layers over the gate electrode, the source region and the drain region by annealing the Co films;
   (f) after the step (e), removing an unreacted portion of the Co films by a first wet cleaning;
   (g) after the step (f), forming CoSi$_2$ layers over the gate electrode, the source region and the drain region by annealing the CoSi layers;
   (h) after the step (g), performing a second wet cleaning by using a solution containing hydrochloric acid and aqueous hydrogen peroxide; and
   (i) after the step (h), forming a silicon nitride film over the MISFET.

8. A manufacturing method of the semiconductor device according to claim 7, further comprising steps of:
   (j) after the step (i), forming an interlayer insulating film over the silicon nitride film; and
   (k) after the step (j), forming a contact hole in the interlayer insulating film and the silicon nitride film by etching the interlayer insulating film and the silicon nitride film,
   wherein, in the step (k), the silicon nitride film has a function as an etching stopper film while etching the interlayer insulating film.

9. A manufacturing method of the semiconductor device according to claim 7,
   wherein, in the step (i), a silane-based gas is employed.

10. A manufacturing method of a semiconductor device according to claim 7,
    wherein, in the step (i), the silicon nitride film is formed by a CVD method.

11. A manufacturing method of a semiconductor device according to claim 10,
    wherein, in the step (i), the silicon nitride film is formed at a temperature of from 700 to 800° C.

12. A manufacturing method of a semiconductor device according to claim 7,
    wherein the MISFET constitutes an n channel MISFET, and
    wherein a tensile stress is generated in a channel region of the MISFET by the silicon nitride film.

13. A manufacturing method of a semiconductor device having a MISFET, comprising the steps of:
    (a) forming a gate insulating film of the MISFET over a semiconductor substrate;
    (b) forming a gate electrode of the MISFET over the gate insulating film;
    (c) forming source and drain regions of the MISFET in the semiconductor substrate;
    (d) depositing Co films over the MISFET;
    (e) after the step (d), forming CoSi layers over the gate electrode, the source region and the drain region by annealing the Co films;
    (f) after the step (e), removing an unreacted portion of the Co films by a first wet cleaning;
    (g) after the step (f), forming CoSi$_2$ layers over the gate electrode, the source region and the drain region by annealing the CoSi layers;
    (h) after the step (g), performing a second wet cleaning by using a solution containing hydrochloric acid and aqueous hydrogen peroxide; and
    (i) after the step (h), forming a silicon nitride film over the MISFET by a CVD method at a temperature of from 700 to 800° C.

14. A manufacturing method of the semiconductor device according to claim 13, further comprising steps of:
(j) after the step (i), forming an interlayer insulating film over the silicon nitride film; and
(k) after the step (j), forming a contact hole in the interlayer insulating film and the silicon nitride film by etching the interlayer insulating film and the silicon nitride film,
wherein, in the step (k), the silicon nitride film has a function as an etching stopper film while etching the interlayer insulating film.

15. A manufacturing method of the semiconductor device according to claim 13,
wherein, in the step (i), a silane-based gas is employed.

16. A manufacturing method of a semiconductor device according to claim 13,
wherein the MISFET constitutes an n channel MISFET, and
wherein a tensile stress is generated in a channel region of the MISFET by the silicon nitride film.

* * * * *